United States Patent
Nair et al.

(10) Patent No.: US 7,242,560 B2
(45) Date of Patent: Jul. 10, 2007

(54) DISCRETE CIRCUIT FOR DRIVING FIELD EFFECT TRANSISTORS

(75) Inventors: Balakrishnan V Nair, Singapore (SG); Gerald A Kilgour, Kokomo, IN (US)

(73) Assignee: Delphi Technologies, Inc, Troy, MI (US)

(*) Notice: Subject to any disclaimer, the term of this patent is extended or adjusted under 35 U.S.C. 154(b) by 95 days.

(21) Appl. No.: 10/940,872

(22) Filed: Sep. 14, 2004

(65) Prior Publication Data

US 2006/0056122 A1    Mar. 16, 2006

(51) Int. Cl.
*H02H 9/00* (2006.01)
(52) U.S. Cl. .......................... 361/56; 361/54
(58) Field of Classification Search .................. 361/56
See application file for complete search history.

(56) References Cited

U.S. PATENT DOCUMENTS

| | | | | |
|---|---|---|---|---|
| 3,253,210 A | * | 5/1966 | Cummins | .................... 322/28 |
| 5,333,196 A | * | 7/1994 | Jakab | .................... 379/413 |
| 5,708,343 A | * | 1/1998 | Hara et al. | ................... 318/599 |
| 6,025,705 A | * | 2/2000 | Nguyen et al. | ............. 323/282 |
| 6,614,633 B1 | * | 9/2003 | Kohno | .................... 361/56 |

* cited by examiner

*Primary Examiner*—Stephen W. Jackson
*Assistant Examiner*—Luis E. Román
(74) *Attorney, Agent, or Firm*—Jimmy L. Funke

(57) ABSTRACT

An electronic circuit for protecting a field effect transistor from high voltage includes a switching device having a first state in which the switching device turns the field effect transistor ON, and a second state in which the switching device turns the field effect transistor OFF. A charging device is connected to the switching device and receives an electrical charge when an electrode of the field effect transistor is shorted to a voltage source. The charging device applies the electrical charge to the switching device to thereby place the switching device in the second state.

17 Claims, 3 Drawing Sheets

DISCRETE CIRCUIT FOR DRIVING FIELD EFFECT TRANSISTORS

BACKGROUND OF THE INVENTION

1. Field of the Invention

The present invention relates to field effect transistors and, more particularly, to circuits for driving field effect transistors.

2. Description of the Related Art

High power field effect transistors (FETs) may be driven by what is referred to as Pre-FET drivers in the form of integrated circuits (ICs). Such Pre-FET drivers may also function to protect the FETs in case of fault conditions such as short-to-battery and short-to-ground, etc. For example, FETs are often used in automotive electronic devices, such as engine control modules (ECMs). If a load connected to the FET shorts out, or if a service technician inadvertently connects a wiring harness in a wrong orientation, it is possible that a FET may be directly,connected to battery voltage, which may result in costly damage to the FET. Another possible function of the Pre-FET driver is to report the fault status back to the microprocessor for further processing.

A problem is that Pre-FET driver ICs are relatively costly. Depending upon the number of channels used, i.e., the number of FETs to be driven, the price of a Pre-FET driver can vary from $0.70 to $1.40. Pre-FET drivers are inflexible in that they are configured to drive four, six or eight channels. Thus, even if only one FET needs to be driven, the minimum configuration of a four channel driving device must be used, which is a relatively costly way to drive a single FET.

Another problem with Pre-FET driver ICs is that each of the channels has a common short-to-battery detection voltage threshold. Thus, it is difficult to interface one single pre-FET driver with a group of FETs that have very large differences in their internal resistances.

Yet another problem with Pre-FET driver ICs is that they require a fixed turn-off time to switch off their outputs in order to protect the FETs in the event of a short-to-battery. More particularly, during and after turn-on, the drain voltages of the external FETs are compared against a fixed short-to-battery threshold voltage, which is generated outside the IC. If the drain voltage exceeds the short-to-battery threshold voltage, then the gate drive will be disabled after a fixed duration. This short-to-battery detection and disable time can vary from 60 to 90 µsec. During this time, the peak short circuit current can rise up to a maximum of 28 to 40 Amps, which can result in damage to the FETs.

What is needed in the art is an inexpensive method of driving power FETs which overcomes the problems associated with Pre-FET driver ICs.

SUMMARY OF THE INVENTION

The present invention provides an inexpensive discrete circuit that can be replicated to drive any number of FETs with individualized short-to-battery threshold voltages, and a reduced short-to-battery turn off time.

In one form, the present invention comprises an electronic circuit for protecting a field effect transistor from high current, including a switching device having a first state in which the switching device turns the field effect transistor ON, and a second state in which the switching device turns the field effect transistor OFF. A charging device is connected to the switching device and receives an electrical charge when an electrode of the field effect transistor is shorted to a voltage source. The charging device applies the electrical charge to the switching device to thereby place the switching device in the second state.

In another form, the present invention comprises an electronic switching circuit including a field effect transistor including a gate, a drain and a source. A switching device is electrically connected to the gate of the field effect transistor. The switching device has a first state in which the switching device applies a first voltage level to the gate to thereby allow current to flow between the drain and the source, and a second state in which the switching device applies a second voltage level to the gate to thereby prevent current from flowing between the drain and the source. A charging device is in electrical communication with the drain such that the charging device receives an electrical charge when the drain is shorted to a voltage source. The charging device applies the electrical charge to the switching device to thereby place the field effect transistor in the second state.

An advantage of the present invention is that discrete driving circuits are less expensive than Pre-FET driver ICs.

Another advantage is that the short circuit detection and shut off time is faster with the discrete driving circuits than with Pre-FET driver ICs.

Yet another advantage is that the short circuit voltage threshold or short circuit current threshold of the FETs are individually controllable.

A further advantage is that the components of the discrete driving circuits can be mounted on either side of the printed circuit board to thereby improve the space efficiency and layout of the printed circuit board.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein.

Figure 1:
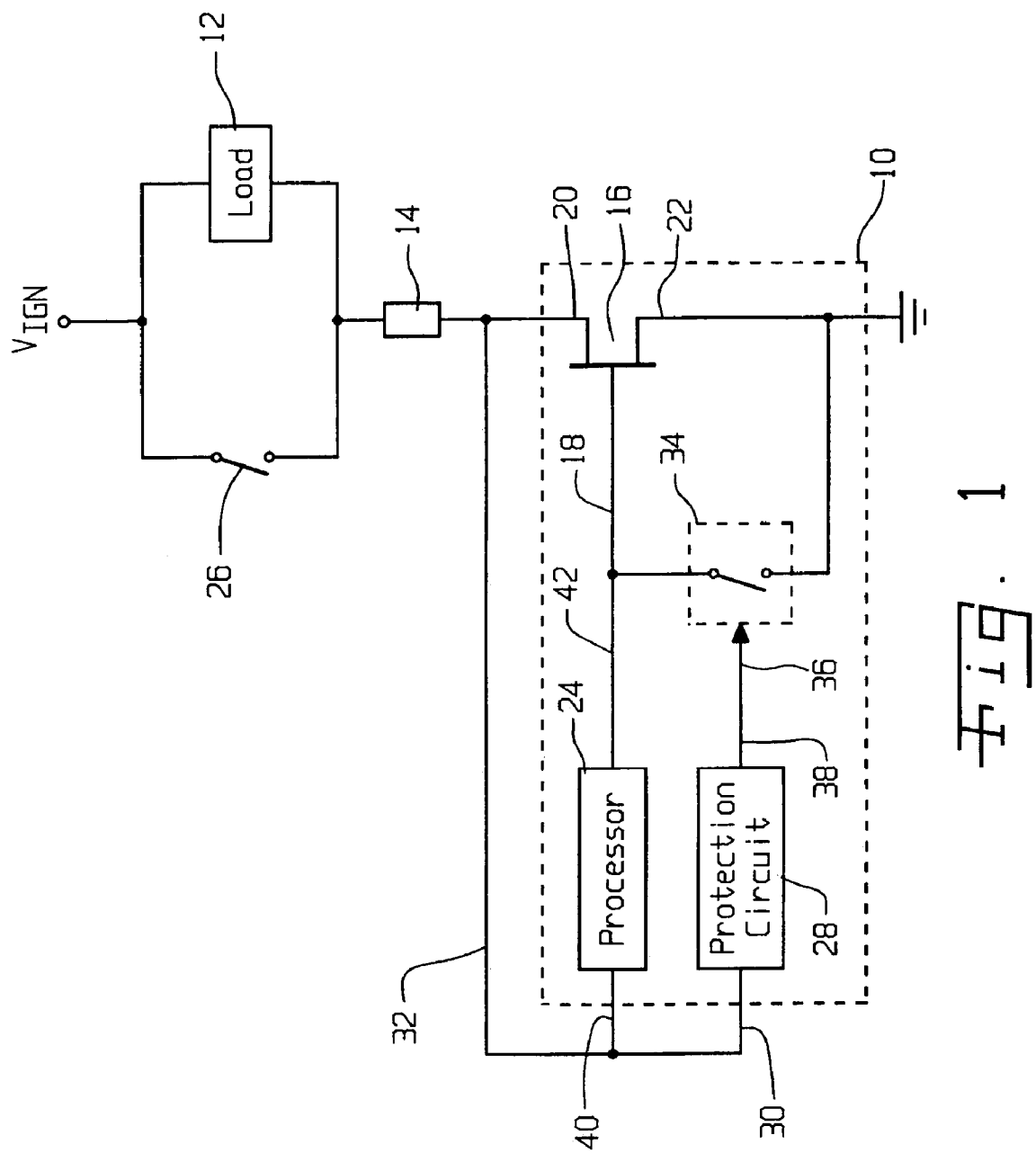
FIG. 1 is a schematic diagram of one embodiment of an electronic switching circuit of the present invention and a load driven by the circuit.

Corresponding reference characters indicate corresponding parts throughout the several views. Although the drawings represent embodiments of the present invention, the drawings are not necessarily to scale and certain features may be exaggerated in order to better illustrate and explain the present invention. The exemplifications set out herein illustrate embodiments of the invention in several forms and such exemplification is not to be construed as limiting the scope of the invention in any manner.

DESCRIPTION OF INVENTION

The embodiments discussed below are not intended to be exhaustive or limit the invention to the precise forms disclosed in the following detailed description. Rather, the embodiments are chosen and described so that others skilled in the art may utilize their teachings.

One embodiment of an electronic switching circuit 10 of the present invention for driving a load 12 is shown in FIG. 1. A wiring harness 14 may electrically interconnect circuit 10 and load 12. In an automotive application, a voltage source provides a vehicle ignition voltage $V_{IGN}$ that may be applied to load 12. Circuit 10 is connected to electrical ground such that circuit 10 may selectively provide a current path from $V_{IGN}$ to ground through load 12, wiring harness 14 and circuit 10. That is, circuit 10 may selectively provide either a short circuit from harness 14 to ground, thereby enabling current to flow through load 12, or an open circuit between harness 14 and ground, thereby preventing current from flowing through load 12. More particularly, circuit 10 includes a field effect transistor (FET) 16 which may selectively provide either a short circuit from harness 14 to ground or an open circuit between harness 14 and ground.

FET 16 includes three electrodes in the form of a gate 18, a drain 20 and a source 22. When a voltage signal is applied to gate 18 current may flow through FET 16 between drain 20 and source 22. Conversely, when no voltage, i.e., a near-zero voltage signal, is applied to gate 18, current is prevented from flowing through FET 16 between drain 20 and source 22. Circuitry 10 includes a processor 24 electrically connected to gate 18 such that processor 24 may selectively apply or not apply a voltage signal to gate 18. Thus, processor 24 may control whether a voltage is applied across load 12 and whether current is allowed to flow through load 12 so that load 12 may operate.

The resistance of load 12 limits the current that may flow through FET 16 and prevents FET 16 from being damaged by high current. Stated another way, there is a voltage drop across load 12 that limits the voltage applied across FET 16, and hence limits the current through FET 16. It is possible, however, for drain 20 of FET 16 to be inadvertently shorted to the voltage source $V_{IGN}$. For example, an internal short circuit may develop within load 12 to thereby inadvertently short drain 20 to $V_{IGN}$. As another example, a service technician may connect wiring harness 14 in a wrong orientation to thereby short circuit drain 20 to the voltage source $V_{IGN}$. Regardless of the cause of the short from drain 20 to $V_{IGN}$, the short may be represented in FIG. 1 as a closing of switch 26.

The short circuiting of drain 20 to the voltage source could possibly result in a voltage drop across FET 16 that is large enough to damage FET 16. That is, the short circuiting of drain 20 to the voltage source could result in a current from drain 20 to source 22 that is large enough to damage FET 16 if the current is sustained at the high level for a sufficient time period.

In order to protect FET 16 from damage resulting from short circuiting, switching circuitry includes a protection circuit 28 for removing any voltage signal from gate 18 when drain 20 is short circuited to a voltage source. More particularly, protection circuit 28 is electrically connected to drain 20 such that protection circuit 28 may sense when the drain voltage exceeds a threshold value. A feedback (FB) input 30 of protection circuit 28 receives a drain voltage signal on line 32. Upon sensing that the drain voltage exceeds a predetermined threshold value, protection circuit 28 causes a switching device 34 to close. As indicated by line 36, protection circuit 28 has an output 38 electrically coupled to switching device 34. The closing of switching device 34 short circuits gate 18 to ground, thereby removing any voltage from gate 18. The removal of voltage from gate 18 prevents current from flowing between drain 20 and source 22, thereby also preventing any damage to FET 16 due to high current.

Processor 24 is also electrically connected to drain 20 such that processor 24 may sense the drain voltage. An input 40 of processor 24 receives a filtered version of the drain voltage signal on line 32. However, the response time of processor 24 is not short enough that processor 24 may remove the output voltage signal on its output 42 to drain 18 in time to prevent damage to FET 16. In order to prevent damage to FET 16 when drain 20 is shorted to a voltage source, voltage may need to be removed from gate 18 in less than 100 microseconds, which may not be within the capabilities of processor 24. However, protection circuit 28 has a response time that is fast enough to remove voltage from gate 18 within 100 microseconds.

Figure 2A:
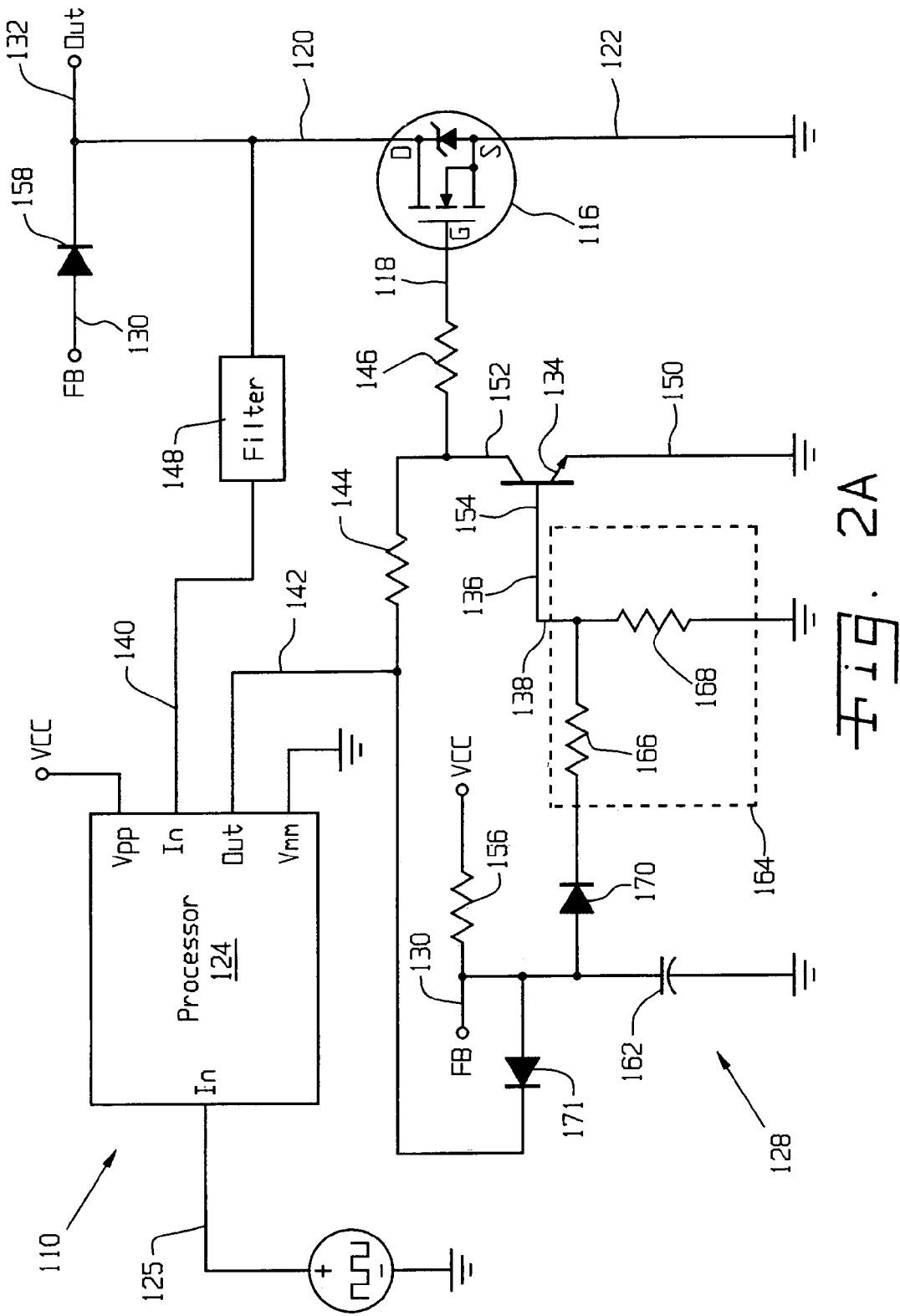
FIG. 2A is a more detailed schematic view of the electronic switching circuit of FIG. 1.
Figure 2B:
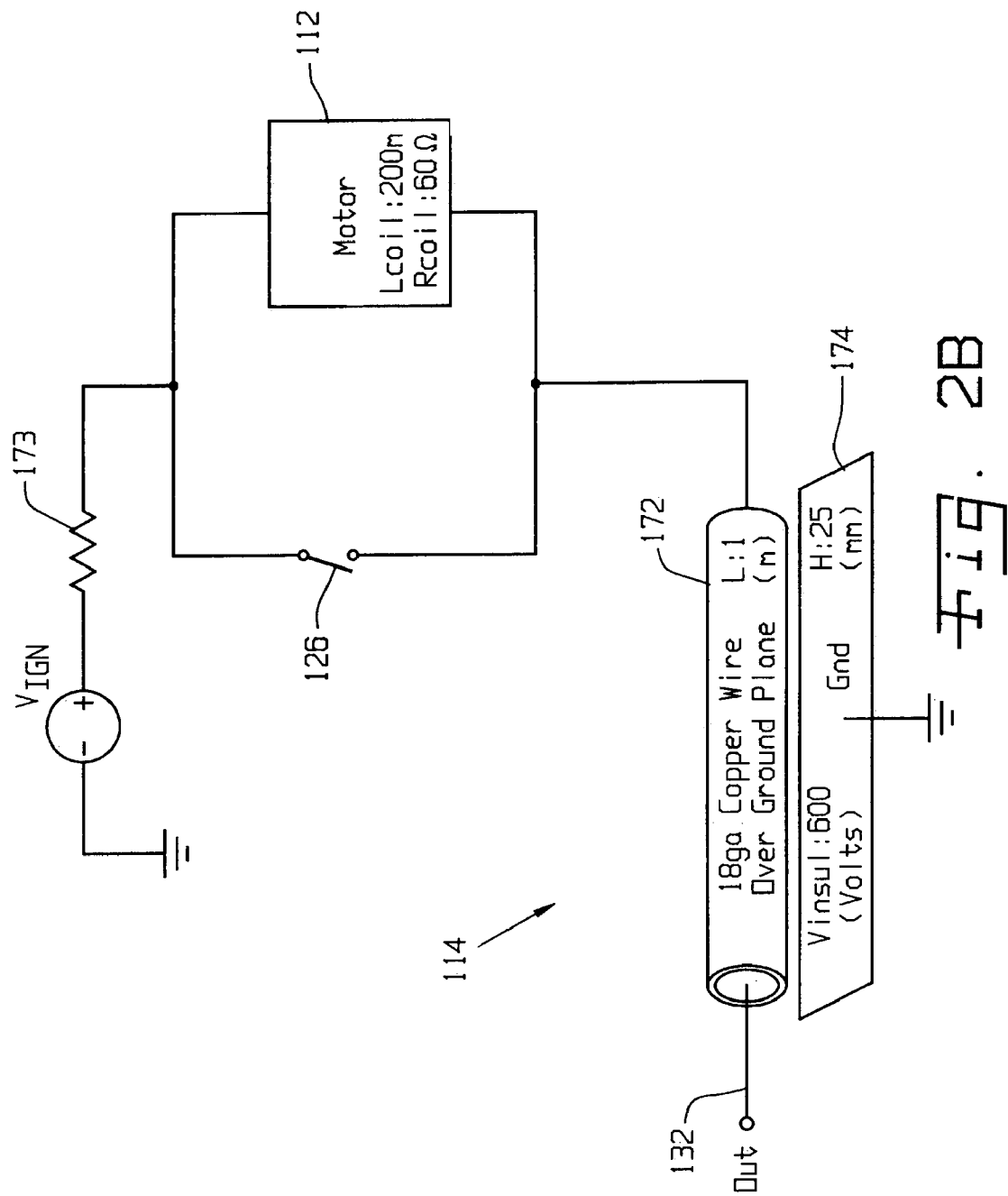
FIG. 2B is a more detailed schematic view of the load and wiring harness of FIG. 1.

A specific embodiment of an electronic switching circuitry 110 is depicted in FIG. 2A, and a corresponding specific embodiment of a load 112 and a wiring harness 114 is depicted in FIG. 2B. Electronic switching circuitry 110 includes a processor 124 receiving a voltage signal on an input 125. In one embodiment, the voltage signal is in the form of a square wave having a period of 400 milliseconds and a width of 200 milliseconds, i.e., a 50% duty cycle. Processor 124 may be electrically connected to a gate 118 of a FET 116 through resistors 144, 146. In one embodiment, resistor 144 has a resistance of 2400 ohms, and resistor 146 has a resistance of 51 ohms. FET 116 may be in the form of an n-channel power MOSFET. In one embodiment, FET 116 is a model IRF7103Q MOSFET sold by International Rectifier Corporation. FET 116 may be part of an engine control module (ECM) or other device that is costly to repair. Drain 120 of FET 116 is electrically connected to an input 140 of processor 124 through a filtering device 148 that reports the fault status of FET 116 to processor 124. A source 122 of FET 116 is grounded.

A switching device 134 is in the form of an npn bi-polar junction transistor having a grounded emitter 150, and a collector 152 that is electrically connected to gate 118 through resistor 146 and to output 142 through resistor 144. A base 154 of transistor 134 is electrically connected to a line 136 which is, in turn, electrically connected to an output 138 of protection circuit 128.

When output 142 of processor 124 is high, a voltage is applied to gate 118 and current may flow from drain 120 to source 122. A $V_{CC}$ voltage of approximately 5 volts may then create a large voltage drop across a resistor 156 as current flows through resistor 156, diode 158, and FET 116 to ground. In one embodiment, resistor 156 has a resistance of 51.1 kiloohms. However, when drain 120 becomes short circuited to a voltage source such as $V_{IGN}$, current may not flow through diode 158 to the higher voltage on line 132. Thus, the current through resistor 156 becomes redirected into a charging device in the form of a charging capacitor 162. In one embodiment, capacitor 162 has a capacitance of 2200 pF, and a voltage rating of 50V. As current flows into capacitor 162, capacitor 162 becomes charged to a voltage level that is limited by the voltage level of drain 120.

Charging capacitor 162 is connected to base 154 of transistor 134 by a voltage divider 164 including resistors 166, 168. In one embodiment, resistor 166 has a resistance of 10 kiloohms, and resistor 168 has a resistance of 51.1 kiloohms. As capacitor 162 becomes charged to the voltage level at feedback input 130 (node FB), a voltage is applied to base 154 through voltage divider 164. When the voltage level $V_{BE}$ at base 154 reaches a predetermined level, such as 0.7 volts, transistor 134 "turns on," and current flows from collector 152 to emitter 150. The current through transistor 134 pulls down the voltage at gate 118 below a threshold voltage at which FET 116 turns off and prevents current flow between drain 120 and source 122. Thus, transistor 134 has a first state, i.e., low $V_{BE}$ and negligible current from collector 152 to emitter 150, in which transistor 134 applies a first voltage level to gate 118 and turns FET 116 ON. Transistor 134 also has a second state, i.e., higher $V_{BE}$ and higher current from collector 152 to emitter 150, in which transistor 134 applies a second voltage level to gate 118 and turns FET 116 OFF. The first voltage level applied to gate 118 in the first state is greater than the second voltage level applied to gate 118 in the second state.

By preventing current flow through FET 116 when drain 120 is inadvertently shorted to a high voltage level, FET 116 is protected from damage that might result from carrying high current levels therein. Protection circuit 128 may turn off FET 116 in less than 100 microseconds. Processor 124 may be informed of the potentially damaging high drain voltage through a filtered voltage signal on input 140. In response, processor 124 may remove the high signal it transmits on output 142, although processor 124 may not be able to do so until after transistor 134 has already pulled down the voltage on gate 118.

Resistor 156 and capacitor 162 together define the time required, after drain 120 is shorted to high voltage, for the base voltage $V_{BE}$ at base 154 to exceed the threshold voltage at which transistor 134 turns on. This required time period is commonly referred to as a time constant of the resistor and capacitor combination.

The relative values of resistors 166 and 168 also affect the time required to turn on transistor 134. More particularly, the relative values of resistors 166 and 168 determine the percentage of the voltage across capacitor 162 (minus the voltage drop of diode 170) that is applied to base 154. In one embodiment, diodes 158, 170 and 171 are all model BAV199 diodes sold by Philips Semiconductors. The values of resistor 156, capacitor 162, and resistors 166, 168 may be selected to turn on transistor 134, and thus turn off FET 116, when drain 120 reaches a selected voltage level. Because different types or models of FETs have different internal resistances between drain and source, different FETs have different levels of drain voltage that they are able to withstand without being damaged thereby. Thus, the values of resistor 156, capacitor 162, and the relative resistance values of resistors 166, 168, may be selectable dependent upon an internal resistance of FET 116 between drain 120 and emitter 122. Because the current through FET 116 may be proportional to the voltage applied across FET 116, the values of resistor 156, capacitor 162, and the relative resistance values of resistors 166, 168, may be selectable dependent upon the voltage level of the voltage source to which the drain voltage may be shorted, such as $V_{IGN}$.

The particular embodiment of load 112 depicted in FIG. 2B is that of a motor having a coil inductance of 200 millihenries and a coil resistance of 60 ohms. Motor 112 may be a motor that drives engine fuel injectors, for example. Drain 120 of FET 116 may be inadvertently shorted to $V_{IGN}$ due to a short within motor 112, or due to a technician connecting wiring harness 114 in an improper manner, for example. The possibility of drain 120 being inadvertently shorted to voltage source $V_{IGN}$ is modelled in FIG. 2b as a switch 126. That is, the shorting of drain 120 to voltage source $V_{IGN}$ may be modelled as a closed switch 126. A resistor 173 models the internal resistance of $V_{IGN}$, and may a value of 0.05 ohm.

The particular embodiment of wiring harness 114 depicted in FIG. 2b is modelled as an 18 gauge copper wire 172 having a length of one meter. A layer of non-conductive insulation 174 having a breakdown voltage of 600 volts surrounds wire 172.

If the FET is of a type having a very low resistance between the drain and the source when the FET is ON, such as less than 30 milliohms, a resistor having a resistance of approximately between 100 milliohms and 200 milliohms may be added in series with the drain of the FET in order to further protect the FET from high current.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

The invention claimed is:

1. An electronic circuit for protecting a field effect transistor from high voltage, comprising:
    a load impedance connecting the drain of the field effect transistor to a DC power source;
    a switching device having:
        a first state in which said switching device is configured to permit the field effect transistor to be turned ON; and
        a second state in which said switching device is configured to turn the field effect transistor OFF; and
    a charging device having a terminal receiving continuous direct charging current from the DC power source through a path not including the field effect transistor, the terminal being connected to said switching device to control the state thereof, the terminal also being connected through a diode to a drain of the field effect transistor for discharging current flow from the charging device through the field effect transistor when the field effect transistor is turned ON whereby the switching device is placed in the first state, the diode being reverse biased when the drain of the field effect transistor is short circuited to the DC electric power source whereby the discharging current flow from the charging device through the field effect transistor is blocked to permit the charging current to charge the charging device and thereby place the switching device in the second state and to latch it in the second state as the field effect transistor is turned OFF.

2. The circuit of claim 1, wherein said switching device comprises a transistor.

3. The circuit of claim 2, wherein said transistor includes a base connected to said charging device, an emitter connected to electrical ground, and a collector configured to be connected to a gate of the field effect transistor.

4. The circuit of claim 3, wherein said collector is connected to an output of a processing device, the processing device selectively providing a signal through the connection for turning the field effect transistor ON.

5. The circuit of claim 4, wherein said output of a processing device is coupled through a resistor to the collector of the transistor and the means operable through the connection provides a field effect transistor turn-on voltage on said output of a processing device for turning the field effect transistor ON when the switching means is in its first state.

6. The circuit of claim 1, wherein said switching device is configured to apply a first voltage level to a gate of the field effect transistor when said switching device is in said first state, and apply a second voltage level to the gate of the field effect transistor when said switching device is in said second state.

7. The circuit of claim 6, wherein the first voltage level is greater than the second voltage level.

8. The circuit of claim 1, wherein said charging device comprises a charging capacitor.

9. The circuit of claim 1, wherein said charging device is configured to receive the electrical charge when a drain of the field effect transistor is inadvertently shorted to the voltage source.

10. The circuit of claim 1, further comprising a voltage divider connecting said charging device to said switching device.

11. The circuit of claim 10, wherein said voltage divider comprises two resistors connected in series, relative resistance values of said resistors being selectable dependent upon:
- an internal resistance of the field effect transistor between a drain and a source of said field effect transistor; and
- a voltage level of said voltage source;

whereby the selection of the relative resistance values of said resistors sets a threshold drain voltage value above which the field effect transistor is turned OFF.

12. An electronic switching circuit, comprising:
- a field effect transistor including a gate, a drain and a source;
- a transistor including a collector electrically connected to said gate of said field effect transistor through a first resistor, said transistor further having a base and an emitter;
- a charging circuit comprising a second resistor;
- a capacitor having a first terminal connected to the charging circuit;
- a first discharge circuit including a first diode coupling the first terminal of the capacitor to the base of the transistor through a third resistor;
- a second discharge circuit including a second diode coupling the first terminal of the capacitor to the drain of the field effect transistor;
- a third discharge circuit including a third diode coupling the first terminal of the capacitor to the collector of the transistor through a fourth resistor; and
- a DC electric power supply having a first terminal electrically coupled through a load to the drain of the field effect transistor and a second terminal coupled to the source of the field effect transistor, the emitter of the transistor, a second terminal of the capacitor and, through a fifth resistor, to the base of the transistor, the electric power supply further providing electric power for the charging circuit, whereby a short circuit of the drain of the field effect transistor to the first terminal of the electric power supply permits the capacitor to charge sufficiently to turn and latch ON the transistor and thus to turn and latch OFF the field effect transistor.

13. The circuit of claim 12, wherein said collector is connected to an output of a processing device.

14. The circuit of claim 13 wherein the processing device is connected to the electric power supply and has an output terminal, the output terminal being connected to the collector through the fourth resistor and also connected to a cathode of the third diode, the processing device being configured to switch the voltage on the output terminal between a first voltage effective to turn OFF the transistor and a second voltage effective to turn ON the field effect transistor when the transistor is turned OFF and there is no short circuit of the drain of the field effect transistor to the first terminal of the electric power supply.

15. The circuit of claim 14 wherein the processing device is configured to switch the voltage on the output terminal upon demand to the first voltage and then to the second voltage, whereby the field effect transistor is unlatched and turned ON after a short circuit of the drain thereof to the first terminal of the power supply has been removed.

16. The circuit of claim 15 wherein the processing device is the primary control of the field effect transistor when there is no short circuit of the drain of the field effect transistor to the first terminal of the electric power supply, the processing device being configured to selectively provide the first voltage or the second voltage on the output terminal, the second voltage being effective to turn the field effect transistor ON and the first voltage being effective to turn the field effect transistor OFF.

17. The circuit of claim 16 wherein the processing device receives a filtered version of the voltage on the drain of the capacitor on an input terminal.

\* \* \* \* \*